United States Patent [19]
Karanicolas et al.

[11] Patent Number: 5,499,027
[45] Date of Patent: Mar. 12, 1996

[54] DIGITALLY SELF-CALIBRATING PIPELINE ANALOG-TO-DIGITAL CONVERTER

[75] Inventors: Andrew N. Karanicolas, Cambridge; Hae-Seung Lee, Arlington, both of Mass.

[73] Assignee: Massachusetts Institute of Technology, Cambridge, Mass.

[21] Appl. No.: 201,250

[22] Filed: Feb. 24, 1994

[51] Int. Cl.[6] ..................................................... H03M 1/10
[52] U.S. Cl. ........................................... 341/120; 341/162
[58] Field of Search ...................................... 341/118, 120, 341/172, 161, 162

[56] References Cited

U.S. PATENT DOCUMENTS

| | | | |
|---|---|---|---|
| 4,593,268 | 6/1986 | Blauschild | 341/118 |
| 4,691,190 | 9/1987 | Robinson | 341/162 |
| 4,894,656 | 1/1990 | Hwang et al. | 341/120 |
| 4,903,026 | 2/1990 | Tiemann et al. | 341/131 |
| 5,047,772 | 9/1991 | Ribner | 341/156 |
| 5,274,377 | 12/1993 | Matsuura et al. | 341/161 |
| 5,283,583 | 2/1994 | Ichihara | 341/162 |
| 5,327,129 | 7/1994 | Soenen et al. | 341/120 |
| 5,416,485 | 5/1995 | Lee | 341/172 |

OTHER PUBLICATIONS

Soenen, Eric, "Error Modeling, Self–Calibration And Design Of Pipelined Analog To Digital Converters"; *UMI Dissertation Services*, vols. 1 and 2.

Soenen, Eric G. and Geiger, Randall L., "An Architecture and An Algorithm for Fully Digital Correction of Monolithic Pipelined ADC's"; *IEE Transactions On Circuits and Systems–II: Analog and Digital Signal Processing*, vol. 42, No. 3, Mar. 1995, pp. 143–153.

Soenen, Eric G. and Geiger, Randall L., "A Fully Digital Self–Calibration Method For High Resolution, Pipelined A/D Converters"; *IEE 36the Midwest Symposium On Circuits And Systems*. Aug. 16–18, 1993.

*Primary Examiner*—Marc S. Hoff
*Attorney, Agent, or Firm*—Samuels, Gauthier & Stevens

[57] ABSTRACT

A self-calibrating pipeline analog-to-digital converter having a plurality of analog-to-digital conversion units and including a recursive calibrating section operable for calibrating errors associated with an immediately preceding first conversion unit. The recursive calibrating section includes circuitry for receiving an analog output signal generated from said first conversion unit in response to an analog input signal provided to the first conversion unit; circuitry for receiving a digital output signal generated from the first conversion unit in response to a digital input signal provided to the first conversion unit; circuitry for generating a conversion signal corresponding to a quantized representation of the analog output signal; and circuitry for generating a calibration signal having a value equal to the conversion signal in response to the digital input signal being a first digital value and having a value equal to the sum of the conversion signal and a calibration value in response to the digital input signal being a second digital value.

14 Claims, 10 Drawing Sheets

Ideal

*FIG. 3A*

Charge Injection Offset

*FIG. 3B*

Comparator Offset

*FIG. 3C*

Capacitor Mismatch

*FIG. 4C* missing codes eliminated

DIGITALLY SELF-CALIBRATING PIPELINE ANALOG-TO-DIGITAL CONVERTER

BACKGROUND OF THE INVENTION

The invention relates to a digitally self-calibrating pipeline analog-to-digital converter.

Analog-to-digital converters (ADCs) are used to quantize electrical signals for digital signal processing. The electrical signals quantized arise from a number of physical phenomenon including, but not limited to, pressure, temperature, acceleration and position. ADCs are used in many engineering realms ranging from consumer products, avionics, medical instrumentation and industrial controls. The advent of powerful digital processing systems has increased the need for high performance ADCs. Two chief parameters summarize the performance of ADCs: the resolution and the sampling rate. The resolution indicates how small of a voltage or current that the ADC can resolve. The sampling rate indicates how fast the electrical inputs can be quantized to digital output words.

In order to increase the performance of systems that use ADCs, there is demand for high-resolution ADCs that operate at high-speed. In addition, the use of increasingly sophisticated digital signal processing (DSP) demands higher performance ADCs to alleviate the amount of analog signal processing that is required. Traditionally, high-resolution, high-speed ADCs relied on expensive hybrid or discrete implementation. Such ADCs are not amendable to low cost manufacturing. The use of monolithic integrated circuit (IC) techniques has been repeatedly demonstrated in the digital and analog circuit domains to be extremely economical for synthesizing electronic systems. Thus, construction of high performance ADCs in low cost, MOS IC processes is paramount for achieving low cost.

Process limitations, however, limit the achievable accuracy because of matching limitations. Typically, component values in ADC algorithms are fundamentally related to each other by ratios of the component values. Thus, ratiometric limitations are fundamental limitations of achievable ADC resolution. In order to achieve precise ratios, high precision component tolerances are required in traditional approaches. This is not compatible with low cost, MOS IC processes. The use of calibration techniques is important to eliminate the need for high precision matching. Self-calibration techniques, which are derived from principles of an ADC algorithm, collectively represent a small set of ADC techniques capable of achieving high resolution without the use of precision matched components or external reference data converters.

Pipeline analog-to-digital converters present advantages compared to flash or successive approximation techniques because potentially high resolution and high speed can be achieved at the same time. A 1-bit per stage design is particularly amenable because each stage is very simple and fast. The primary limitations to the accuracy of a switched-capacitor pipeline ADC are capacitor mismatch, charge injection, finite operational amplifier gain and comparator offset. Conventional 1-bit per stage ADCs, including algorithmic and pipeline ADCs, have removed some of these errors by using extra clock cycles with ratio independent, reference refreshing, error averaging and analog calibration techniques. Although the analog calibration does not require extra clock cycles during normal conversions, a weighted capacitor array is needed for each stage to be calibrated. For pipeline ADCs, where many stages are calibrated, the added complexity and capacitive load is significant.

SUMMARY OF THE INVENTION

The present invention provides a self-calibrating pipeline analog-to-digital converter having a plurality of analog-to-digital conversion units and including a recursive calibrating section operable for calibrating errors associated with an immediately preceding first conversion unit. The recursive calibrating section includes means for receiving an analog output signal generated from said first conversion unit in response to an analog input signal provided to the first conversion unit; means for receiving a digital output signal generated from the first conversion unit in response to a digital input signal provided to the first conversion unit; means for generating a conversion signal corresponding to a quantized representation of the analog output signal; and means for generating a calibration signal having a value equal to the conversion signal in response to the digital input signal being a first digital value and having a value equal to the sum of the conversion signal and a calibration value in response to the digital input signal being a second digital value.

According to one aspect of the present invention, a digital self-calibration process is provided which establishes a general method for digital self-calibration of high-speed, high-resolution, pipeline sub-ranging ADCs. The invention addresses the traditional limitations of high-resolution ADCs including ratiometric and offset errors, among others, that arise in monolithic integrated circuit (IC) processes as well as in hybrid and discrete construction methods.

According to another aspect of the present invention there is provided a pipeline architecture which disconnects the pipeline at a stage to be calibrated and permits special calibration inputs to be applied to the selected stage input. By first applying the calibration inputs at the input of an end section of the pipeline, a calibrated pipeline section is synthesized which in turn is used with the preceding pipeline stage to synthesize a higher resolution calibrated pipeline section. This hierarchical process is repeated until the beginning of the pipeline is reached, and thus the entire pipeline is calibrated. The result is a very efficient digital self-calibration process. The digital self-calibration can be applied to an arbitrary number of stages each resolving an arbitrary number of bits. With a certain resolution ADC of any type provided, sub-ranging stages can precede this ADC and then digital self-calibration can be used to arrive at a higher resolution ADC. The invention is amenable to cyclic ADCs as well as pipeline ADCs structures. Cyclic ADCs tradeoff hardware reduction with decreased throughput relative to a pipeline. The advantage of cyclic ADCs is that they are small but require more clock cycles for a conversion. The digital self-calibration hardware scales down with cyclic ADC hardware reduction. Accordingly, the digital self-calibration of the present invention can be used with a pipeline, cyclic or combination of these architectures with other ADC architectures to attain high-resolution ADCs at a wide range of conversion speeds.

One of the advantages of the present invention is that the pipeline converter itself is used in the calibration mode. Thus, no external reference data converters are needed in the invention. No high precision components are required. The digital self-calibration can attain 15-bits of linearity from component matching no better than 7-bits. Accordingly, the calibration scheme represents a true self-calibration. The errors are directly measured under the same condition as during the run mode. The calibration data is obtained by use of a simple set of d-c calibration inputs that are indistinguishable from a previous stage output. In addition, the calibration data is obtained with the pipeline ADC operating at full speed. The digital self-calibration performs a very simple calibration process in the digital domain alone. The calibration data obtained at full speed is then stored in a small digital memory to be combined with the run mode raw data in accordance with the digital self-calibration process which arrives at the calibrated output. As a result of the process simplicity, no multipliers, microprocessors or other complex arithmetic systems are required in the invention. Since the calibration process is all digital, no extra analog hardware is required for calibration mode or run mode.

A further aspect of the present invention provides a digital self-calibration technique based on a radix 1.93 and one comparator per stage conversion algorithm. Non-radix 2 conversion algorithms have been previously employed in successive approximation converters. The technique required a precise external calibration source and hence could be factory-calibrated only. The calibration technique described with respect to the present invention is self-calibrating, simple and tolerant to comparator errors. The non-unity gain resulting from the approach of the present invention can be easily compensated elsewhere in the system. In addition, the digital calibration of the present invention may be applied to pipeline or cyclic ADC architectures.

Another advantage of the digital calibration described herein is that the errors at the carry transitions are directly measured under the same condition as during the normal conversion. Therefore, the present invention offers potentially higher calibration accuracy than other conventional calibration techniques which measure the error at different conditions than the actual conversion. Another important aspect of this design is that the calibration is performed in the digital domain so no extra analog circuitry, such as weighted capacitor arrays, are needed and no extra clock cycles are required during the conversion. The digital calibration of the present invention automatically accounts for capacitor mismatch, capacitor non-linearity, charge injection, finite op-amp gain and comparator offsets. The nominal offsets of circuit components such as the op-amp and comparator are reduced by standard offset cancellation and subsequently eliminated by the digital calibration.

Unlike analog calibration, the digital calibration in accordance with the present invention does not correct or create analog decision levels. Therefore, the uncalibrated ADC must provide decision levels spaced no greater than one LSB at the intended resolution. In typical 1-bit per stage pipeline ADCs, missing decision levels results when the input of any of the stages exceeds the full scale due to capacitor mismatches, capacitor non-linearity, charge injection, finite op-amp gain and comparator offsets. The missing decision levels cannot be removed by digital calibration alone. Missing decision levels can be eliminated, however, by using gain less than two and between two and three more stages of pipeline which gives enough redundancy in the analog decision levels. With gain less than 2, missing codes are introduced rather than missing decision levels. The missing codes that result with a gain less than 2 are eliminated by the digital calibration. In contrast to calibrations using gain less than 2, the calibration of the present invention is much simpler and more accurate. No multiplication is needed in the calibration algorithm and only a small digital memory is required.

DETAILED DESCRIPTION OF THE ILLUSTRATED EMBODIMENTS

Figure 1:
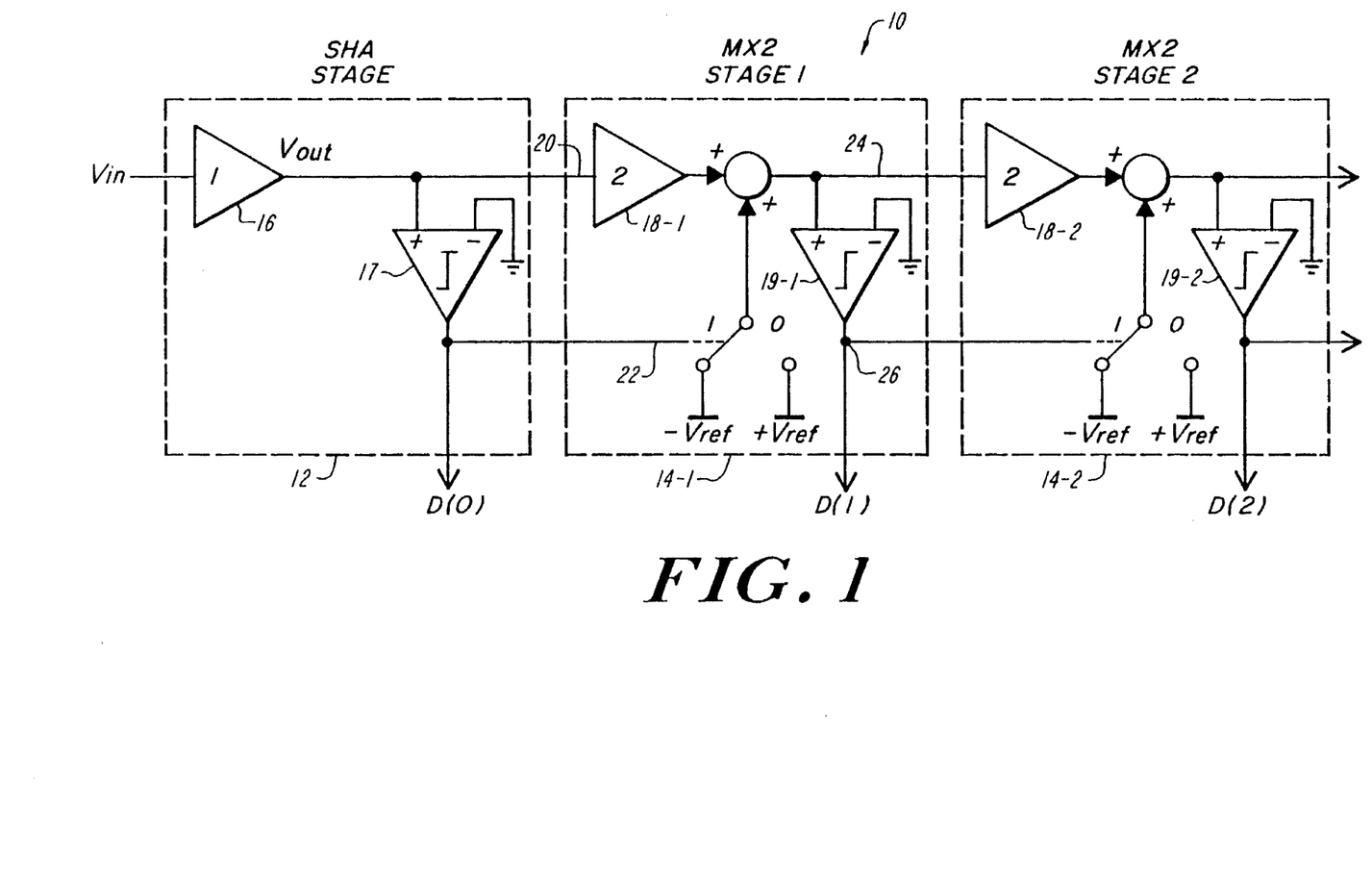
FIG. 1 shows an exemplary 1-bit per stage pipeline architecture ADC in accordance with the present invention.

With reference to FIG. 1, an exemplary 1-bit per stage pipeline architecture ADC 10 is shown in accordance with the present invention. The pipeline ADC 10 begins with a sample-hold-amplifier (SHA) stage 12 and is then followed by multiply-by-two (MX2) stages 14-1 through 14-N. For illustrative purposes, the exemplary pipeline ADC 10 includes an input SHA stage and 17 MX2 stages that provide decision level redundancy for a 15$b$ resolution. The SHA stage 12 has a sample-hold amplifier 16 and a comparator 17. The remaining MX2 stages each include a multiply-by-two 18 and a comparator 19. Each MX2 stage has an analog input 20 and a 1-bit digital input 22, as well as an analog output 24 and a 1-bit digital output 26. The gain-of-1 and gain-of-2 functions for the SHA and the MX2 stages are performed using operational amplifiers in conventionally known closed loop configurations. The SHA and MX2 stages each utilize a comparator to determine the respective output bits. Only single ended systems are illustrated herein for simplicity of explanation though the actual system can be fully-differential.

The radix 2 1-bit per stage ADC process utilized in accordance with the present invention is now described. As shown in FIG. 1, the analog input $V_{in}$ of the ADC is first sampled by the sample-hold amplifier 16. The comparator 17 monitors the SHA 16 output $V_{out}(0)$ resulting in the digital output D(0)=1 if $V_{out}$ is positive or D(0)=0 if $V_{out}$ is negative. The SHA output $V_{out}(0)$ is then passed to MX2 Stage 1 (14-1). Thus, the input to MX2 Stage 1 is $V_{in}(1)$= $V_{out}(0)$. The output $V_{out}(1)$ of MX2 Stage 1 is $2V_{in}(1)-V_{ref}$ if D(0)=1, or is $2V_{in}(1)+V_{ref}$ if D(0)=0. The comparator 19-1 monitors $V_{out}(1)$ in MX2 Stage 1 and results in D(1)=1 if $V_{out}(1)$ is positive and results in D(1)=0 if $V_{out}(1)$ is negative. This data is then passed on to the remaining MX2 stages in a similar manner.

Figure 2A:
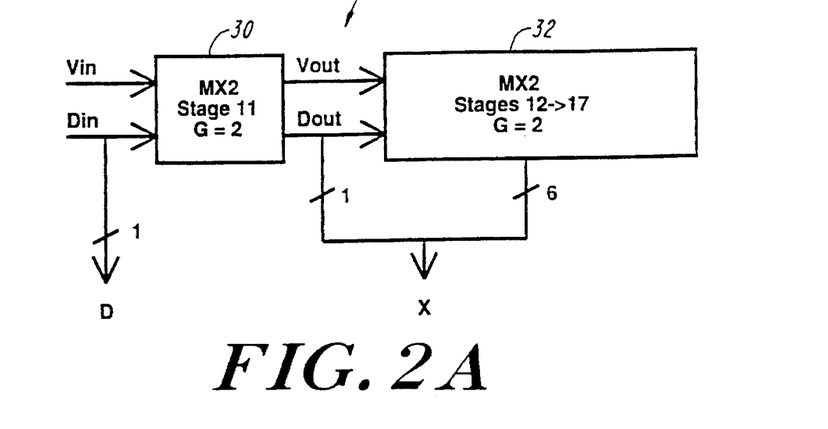
FIGS. 2A–2C show the ideal residue and transfer characteristic for an exemplary radix 2 pipeline ADC.
Figure 2B:
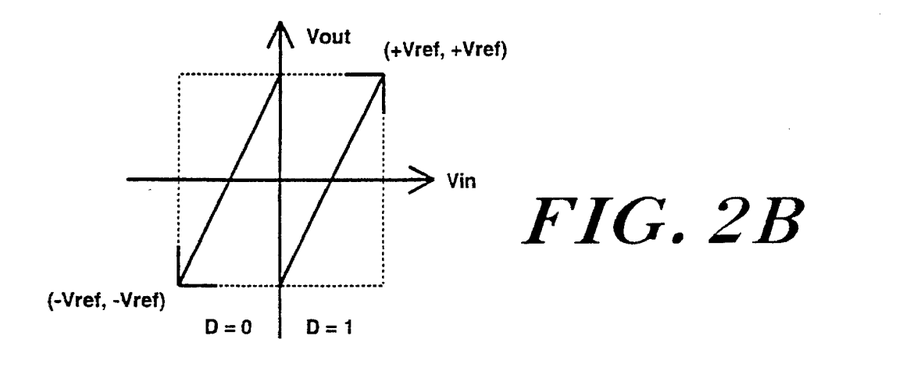
Figure 2C:
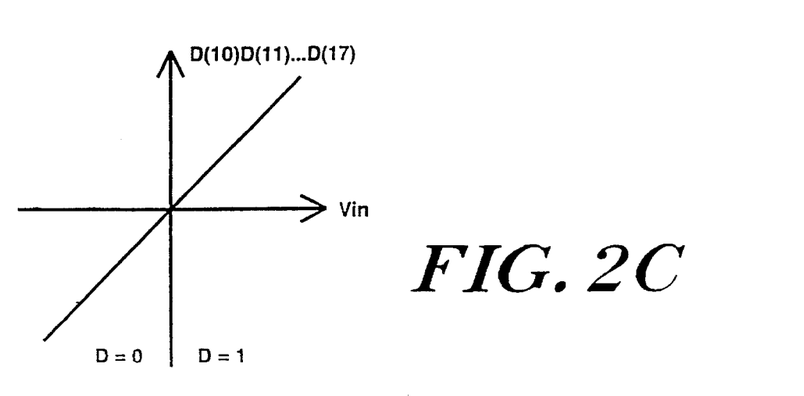

FIGS. 2A–2C show the ideal residue and transfer characteristic for the exemplary radix 2 pipeline ADC 10. The MX2 Stage 11 (30) is in focus and is assumed to be ideal. The remaining 6 stages 32 of the pipeline ADC are also assumed ideal. The residue plot of FIG. 2B shows the residue output $V_{out}$ of a MX2 stage plotted as a function of the MX2 stage input $V_{in}$ for the cases D=0 and D=1. The bit D is the bit D(10) provided from the previous MX2 Stage 10. It will be appreciated that the stage designation has been omitted from $V_{in}$ and $V_{out}$ for simplicity.

The quantized representation of the residue output $V_{out}$ is composed of bits D(11)D(12) ... D(17) and will hereinafter be referred to as the data word X. The output D(10)D(11) ... D(17) is identified as the quantized representation of $V_{in}$. The digital output D(10)D(11) ... D(17) is plotted as a function of $V_{in}$ resulting in an ideal transfer characteristic as shown in FIG. 2C. Although D(10)D(11) ... D(17) assumes discrete values, the transfer characteristic is plotted continuously for simplicity.

Figures 3A, 3B:
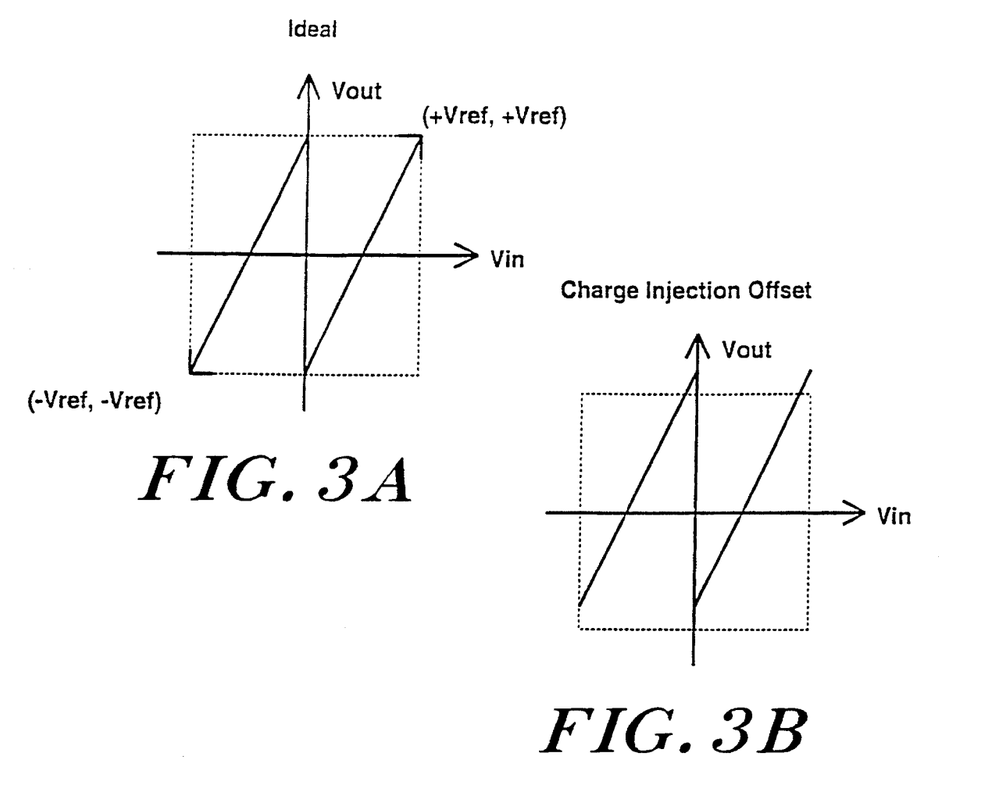
FIGS. 3A–3D show the ideal residue plot and the effects of principal errors on the residue plot.
Figure 3C:
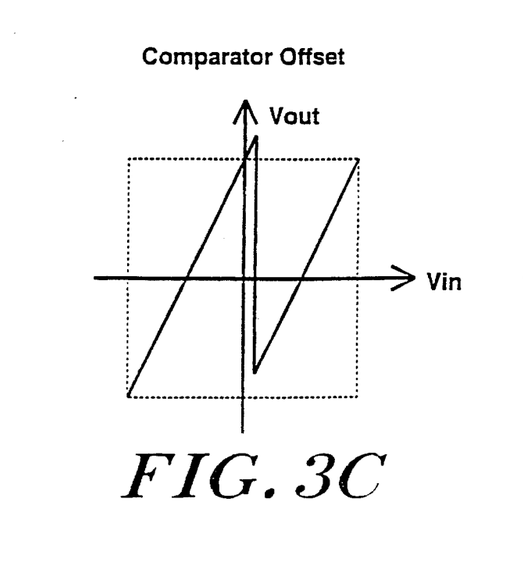
Figure 3D:
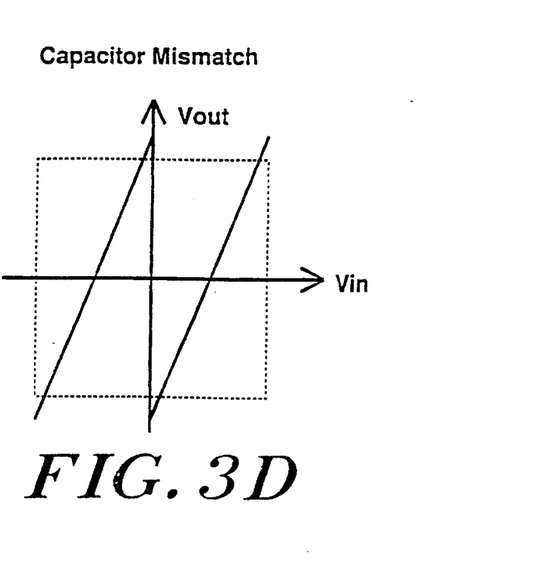

FIGS. 3A–3D show the ideal residue plot and the effects of principal errors on the residue plot. The dashed box represents the reference boundary that passes through coordinates $\pm V_{ref}$ along the $V_{out}$ axis and $\pm V_{ref}$ along the $V_{in}$ axis. Charge injection offset causes a vertical shift of the residue plot as shown in FIG. 3B. Near the major carry transition point, the residue exceeds the reference boundary resulting in missing decision levels. This is due to the remaining pipeline section being saturated so that the output code does not change for the corresponding range of analog input. Near the major carry transition point, the residue minimum does not extend to $-V_{ref}$ resulting in a gap from the minimum to the reference boundary. As a result, missing codes result. This is due to the full input range of the remaining pipeline section not being accessed. Comparator offset, as shown in FIG. 3C, causes a shift of the major carry transition point. This leads to the residue exceeding the reference boundary as well as leading to a gap to the reference boundary. Again, missing decision levels and missing codes result, respectively. Finally, capacitor mismatch as indicated in FIG. 3D causes the residue to exceed the reference boundary near the major carry transition point resulting in missing decision levels. Capacitor mismatch could also lead to a gap from the residue extreme to the reference boundary near the major carry transition point resulting in missing codes.

As previously described, when the output of any stage in a radix 2 pipeline ADC exceeds $\pm V_{ref}$, missing decision levels occur, which cannot be eliminated by digital calibration alone. The key is to use a nominal gain less than 2 such that the output of each stage never exceeds $\pm V_{ref}$. For the case of radix less than 2, the principal errors affect the residue output in a similar manner as with the case of radix 2. Since the residue is maintained within the reference boundary, no missing decision levels result. The missing codes that result, due to the gaps from the residue extrema to the reference boundary, are eliminated with digital calibration.

One of the primary objectives of the digital calibration in accordance with the present invention is to eliminate ratiometric errors due to capacitor mismatch. The specific value of the reduced radix is not central to the operation of the digital calibration process. In addition, the gains can be different among the stages to be calibrated. The gain needs to be reduced enough so that the residue is contained within the reference boundary. Excessive gain reduction decreases the total number of decision levels available and requires an excessive number of additional stages.

The exemplary pipeline ADC 10, presented for illustrative purposes, has the first 11 stages with nominal gains set to 1.93 and the last 6 stages with nominal gains set to 2. The calibration begins with the 11th stage, then continues with the 10th stage, up to the first stage. The gain of 1.93 was chosen to ensure enough gain reduction so that the residue never exceeds the reference boundary in the worst case when the maximum capacitor mismatch, comparator offset and charge injection error magnitudes are summed together.

Figure 4A:
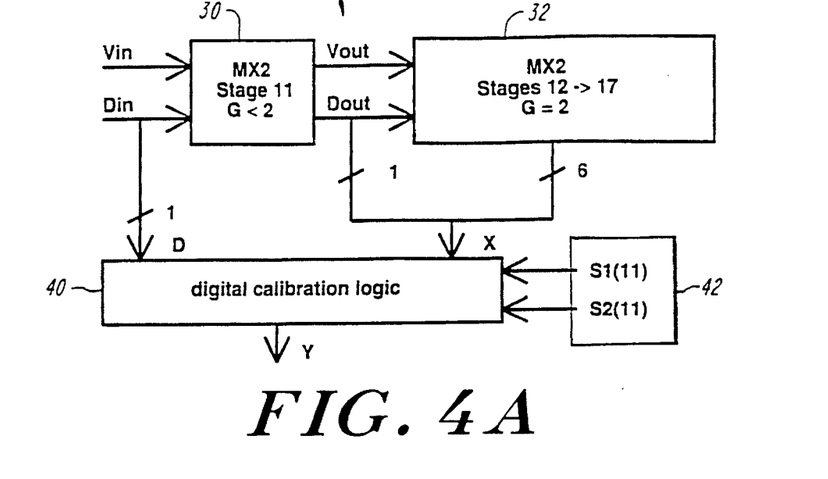
FIGS. 4A–4C show the pipeline ADC in accordance with the present invention with digital calibration of the 11th stage, and the residue and transfer characteristic plots of MX2 Stage 11 with gain reduction and zero comparator offset.
Figure 4B:
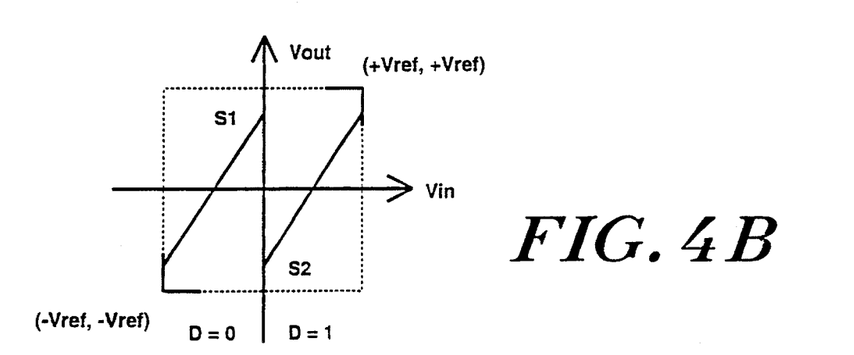

FIG. 4A shows the pipeline ADC 10 with digital calibration of the 11th stage. The last 6 stages 32 of the pipeline have nominal gains set to 2. In FIG. 4B, the residue plot of MX2 Stage 11 (30) with gain reduction and zero comparator offset is shown. An exaggerated gain reduction is indicated for simplicity in illustration. The outputs D and X are provided to digital calibration logic 40 along with calibration constants $S_1$ and $S_2$ determined for Stage 11. The two quantities $S_1$ and $S_2$ are identified on the residue plot of FIG. 4B. $S_1$ and $S_2$ correspond to the quantized representation of $V_{out}$, or the quantity X, when $V_{in}=0$ with D=0 and D=1, respectively.

Figure 4C:
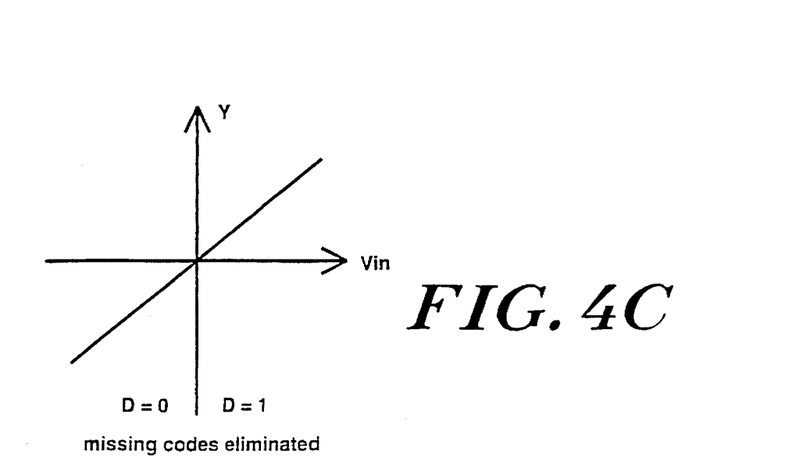

The digital self-calibration process in accordance with the present invention is described as follows:

$$Y=X, \text{ if } D=0 \qquad (1)$$

$$Y=X+S_1-S_2, \text{ if } D=1 \qquad (2)$$

where D is the bit decision, X is the raw code and Y is the transformed code. This transform ensures that the output code Y with $V_{in}=0$ is the same for D=0 and D=1, eliminating missing codes as shown in FIG. 4C. It will be appreciated that no multiplication is required in this calibration scheme. Two constants $S_1$ and $S_2$ are required per stage. The entire converter uses a 132b memory 42 to store $S_1-S_2$ for each stage being calibrated. To initially determine $S_1$, the analog input is set to zero and the input bit is forced to 0. The quantity X in this condition is $S_1$. In an analogous manner, $S_2$ is determined when the input bit is forced to 1. The calibration constants $S_1$ and $S_2$ are each obtained by averaging 2048 samples without truncation and then truncating the final result.

Figure 5:
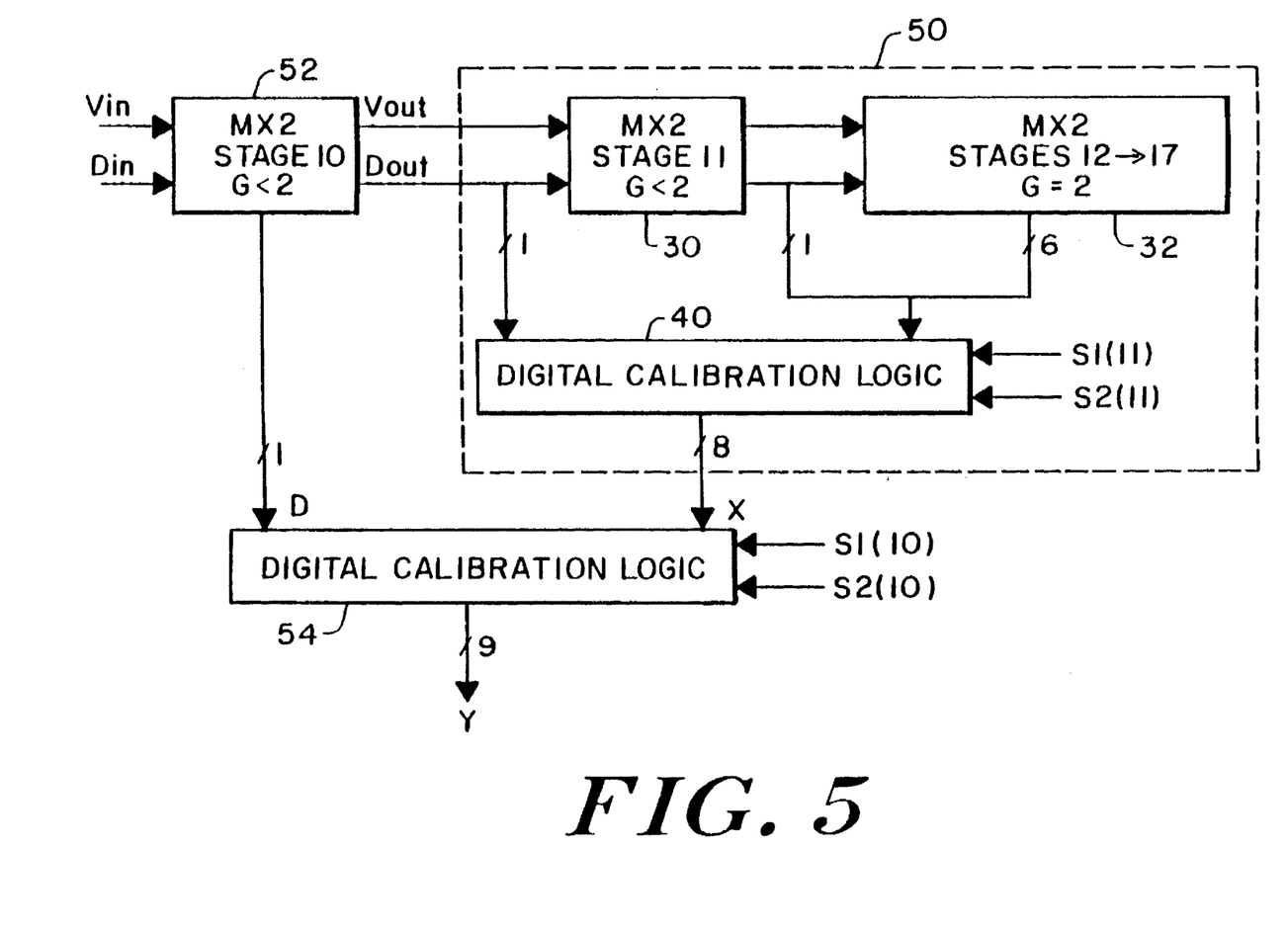
FIG. 5 shows the digital calibration of higher level stages of the pipeline ADC in accordance with the present invention.

With the digital calibration of one MX2 stage accomplished, the digital calibration of higher level stages can proceed. FIG. 5 demonstrates the process. The system within the dashed-box 50 has been of principal interest thus far. The last 6 stages with nominal gain of 2 were used to calibrate Stage 11, along with the digital calibration logic 40 and calibration constants. The calibrated system 50 is now used as an ADC to measure MX2 Stage 10 (52). Calibration constants $S_1$ and $S_2$ for Stage 10 are determined in a similar manner as for Stage 11. Digital calibration logic 54 follows the same process as described previously. The calibrated output Y is then used to calibrate MX2 Stage 9. This calibration process continues up to the first MX2 stage and may include the SHA. Quantization and truncation errors are avoided by averaging the calibration data without truncation. The calibration process described herein results in a large input referred offset. However, this offset is constant and hence eliminated by digitally subtracting the offset measured with 0 V at the SHA input.

Since the calibration aligns points $S_1$ and $S_2$ using measured values under the same condition as during normal conversion, the calibration automatically accounts for capacitor mismatch, charge injection and finite op-amp gain. Capacitor non-linearity causes only integral non-linearity (INL) error, not differential non-linearity (DNL) error. It will be hereinafter shown that comparator errors up to the gain reduction factor (3.5% of full scale) have no effect on the conversion accuracy. Due to the nominal radix of 1.93, the calibrated output code has non-unity nominal gain which can be easily compensated elsewhere in the system. In the exemplary ADC 10, input voltages corresponding to ±0.95 $V_{ref}$ give full scale output codes for 15b. It will be appreciated that only digital addition, subtraction and a small digital storage are needed for the digital calibration process in accordance with the present invention. With a 1 MS/s conversion rate and 2048 point averaging, the total calibration time for the converter is approximately 70 ms.

Figure 6:
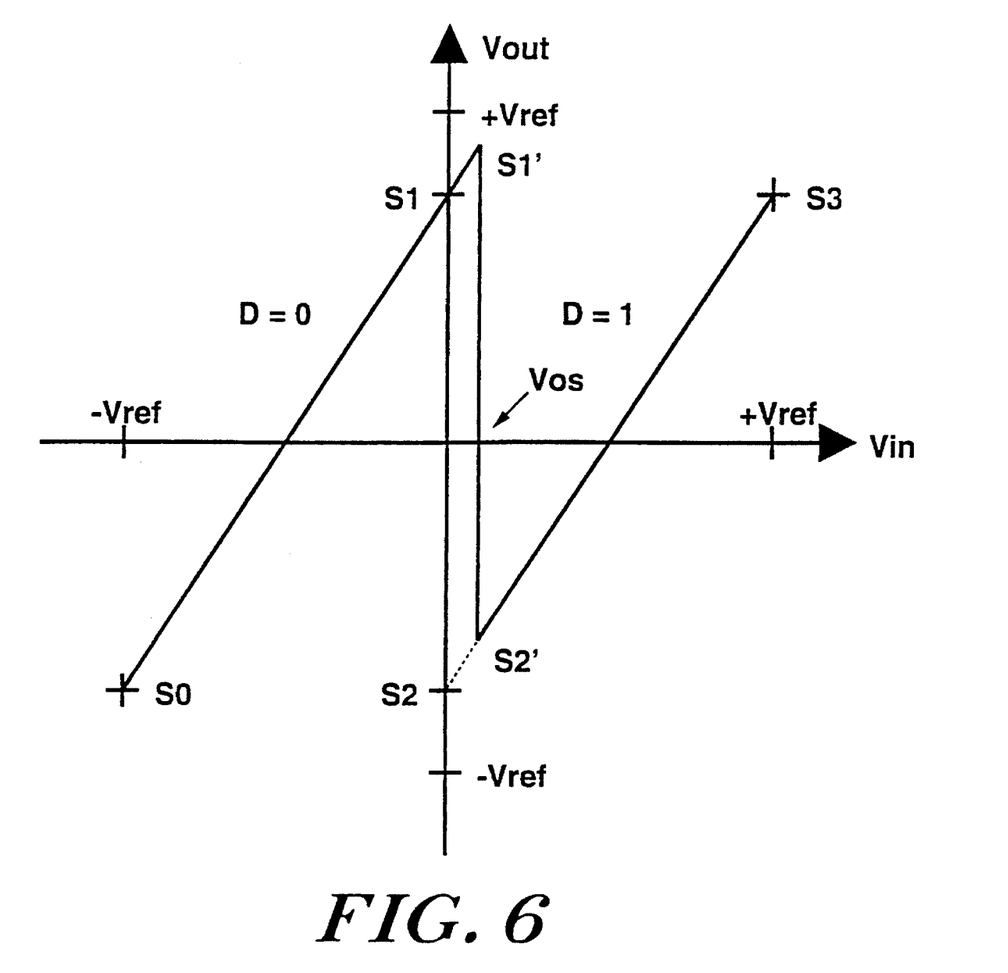
FIG. 6 shows the residue plot for a radix less than 2 MX2 stage with comparator offset present in the previous stage.

A principal advantage of the digital self-calibration technique of the present invention is that it accounts for capacitor mismatch and charge injection. Another advantage of the digital calibration process of the present invention is that it is tolerant of comparator offset. FIG. 6 shows the residue plot for a radix less than 2 MX2 stage with comparator offset present in the previous stage. As is illustrated, the major carry transition point is shifted. The calibration constants $S'_1$ and $S'_2$ correspond to the extrema of the residue plot near the major carry transition point. The result is that $S'_1 - S_1 = S'_2 - S_2$. Accordingly, $S'_1 - S'_2 = S_1 - S_2$. Equation 2, therefor, remains unchanged. This is important because the comparator offset requirement can be relaxed. In the example presented, comparator offset up to 1.75% of $V_{ref}$ is corrected by calibration, which is equivalent to a 3.5% residue output referred error. The comparator offset in question can be static or dynamic. The digital self-calibration of the present invention will remove this error as long as the comparator offset is low enough so that the residue does not exceed the reference boundary. When capacitor mismatch, charge injection and comparator offset are simultaneously present, the combined output referred error must remain less than 3.5% of $V_{ref}$ for the calibration to be feasible.

A finite op-amp gain can be tolerated with the digital self-calibration process described herein. This effect represents a gain error and is not distinct from capacitor mismatch if the gain is finite, but constant. Temperature can cause the gain to drift and this will require recalibration. To avoid this need of recalibration, the pipeline ADC 10 uses a high d-c gain op-amp design.

Figure 7:
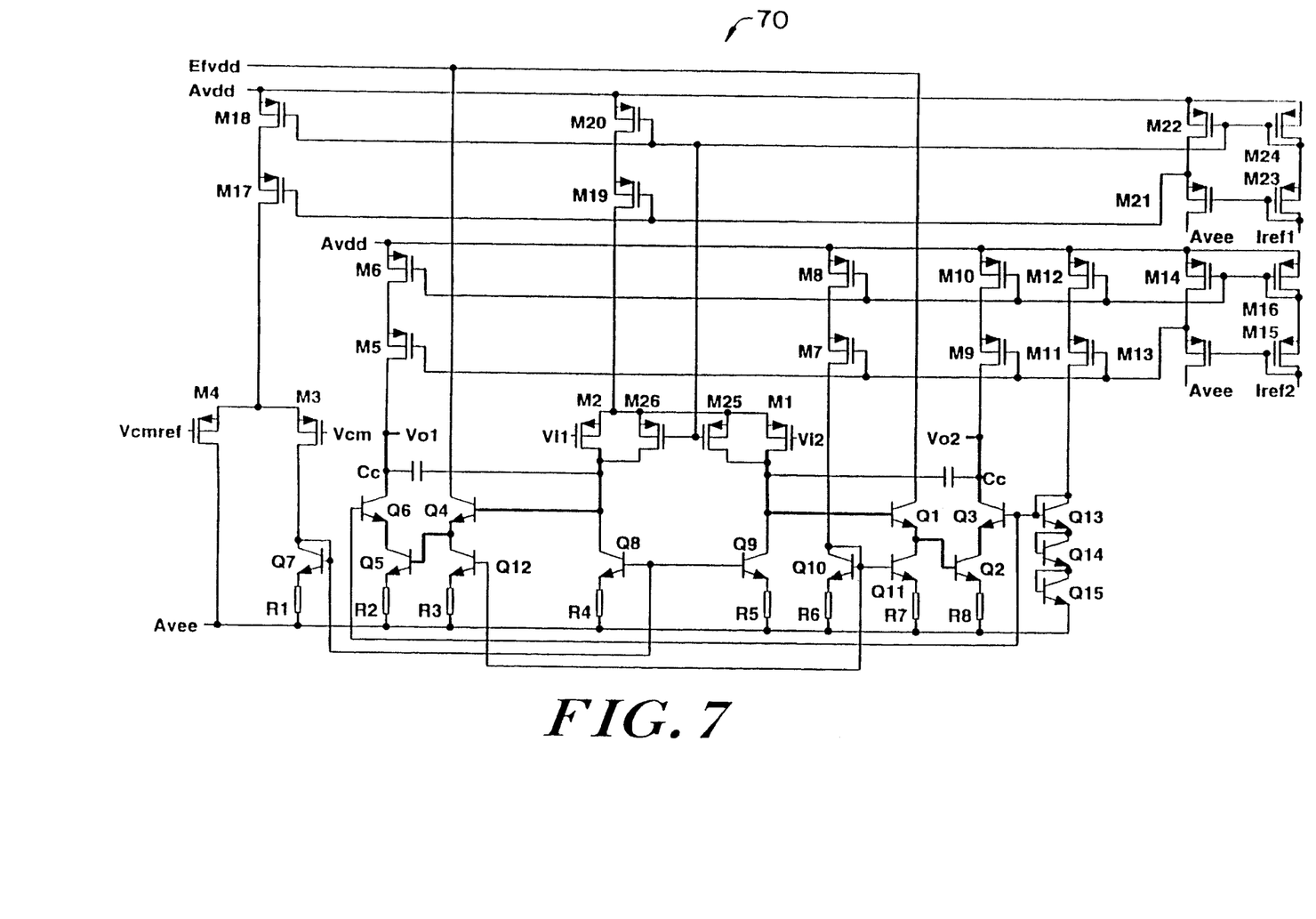
FIG. 7 shows an exemplary operational amplifier for use with the pipeline ADC of the present invention.

BiCMOS is used to provide n-p-n bipolar devices for high-speed, high-gain analog capability while providing CMOS devices for a switched-capacitor environment. An exemplary operational amplifier 70 for use with the pipeline ADC of the present invention is shown in FIG. 7. The op-amp 70 is a two-stage, fully-differential design with a 100 MHz unity-gain bandwidth and a 125 dB d-c gain. A PMOS differential input stage, composed of devices $M_1$ and $M_2$, is used for lower $1f$ noise and lower threshold voltage relaxation, compared to NMOS. Focus will be placed on the right half of the remainder of the op-amp signal path. An n-p-n bipolar second stage $Q_2$ is used to achieve a high-frequency non-dominant pole. The second stage is cascoded with device $Q_3$ and then actively loaded with a cascoded current source, composed of devices $M_9$ and $M_{10}$, to obtain the high output resistance used to help achieve large op-amp d-c gain. This large d-c gain is desirable to avoid the need for recalibration due to gain drift arising, for instance, from a temperature change.

Device $Q_1$ is used as an emitter follower to prevent the second stage from excessively loading the first stage output and thus reducing the d-c gain. Compensation capacitor $C_c$ is used for pole-split compensation of the op-amp. A dynamic common mode feedback scheme is used to sense the output common mode level of the op-amp. The voltage $V_{CM}$ represents the output common mode level. A differential pair composed of devices $M_3$ and $M_4$ is used to steer common mode current to the first stage of the op-amp. This completes the common mode negative feedback loop that tends to drive $V_{CM}$ equal to $V_{CMREF}$, thus stabilizing the output common mode level.

The voltage $V_{CMREF}$ is set between the power supply rails or ground for a positive and negative power supply scheme. Devices $M_{25}$ and $M_{26}$ are used to avoid a start-up difficulty in the output common mode level when the power supply is turned on. If the output common mode level is near the $A_{VDD}$ power supply rail, then the input differential pair bias current source $M_{19}$ could be cutoff and the op-amp output common mode level could remain at the $A_{VDD}$ power supply rail. However, $M_{25}$ and $M_{26}$ turn on in this condition to drive the output common mode level away from $A_{VDD}$, as desired. Once the output common mode level is stabilized, devices $M_{25}$ and $M_{26}$ remain cutoff for normal op-amp operation.

Figure 8:
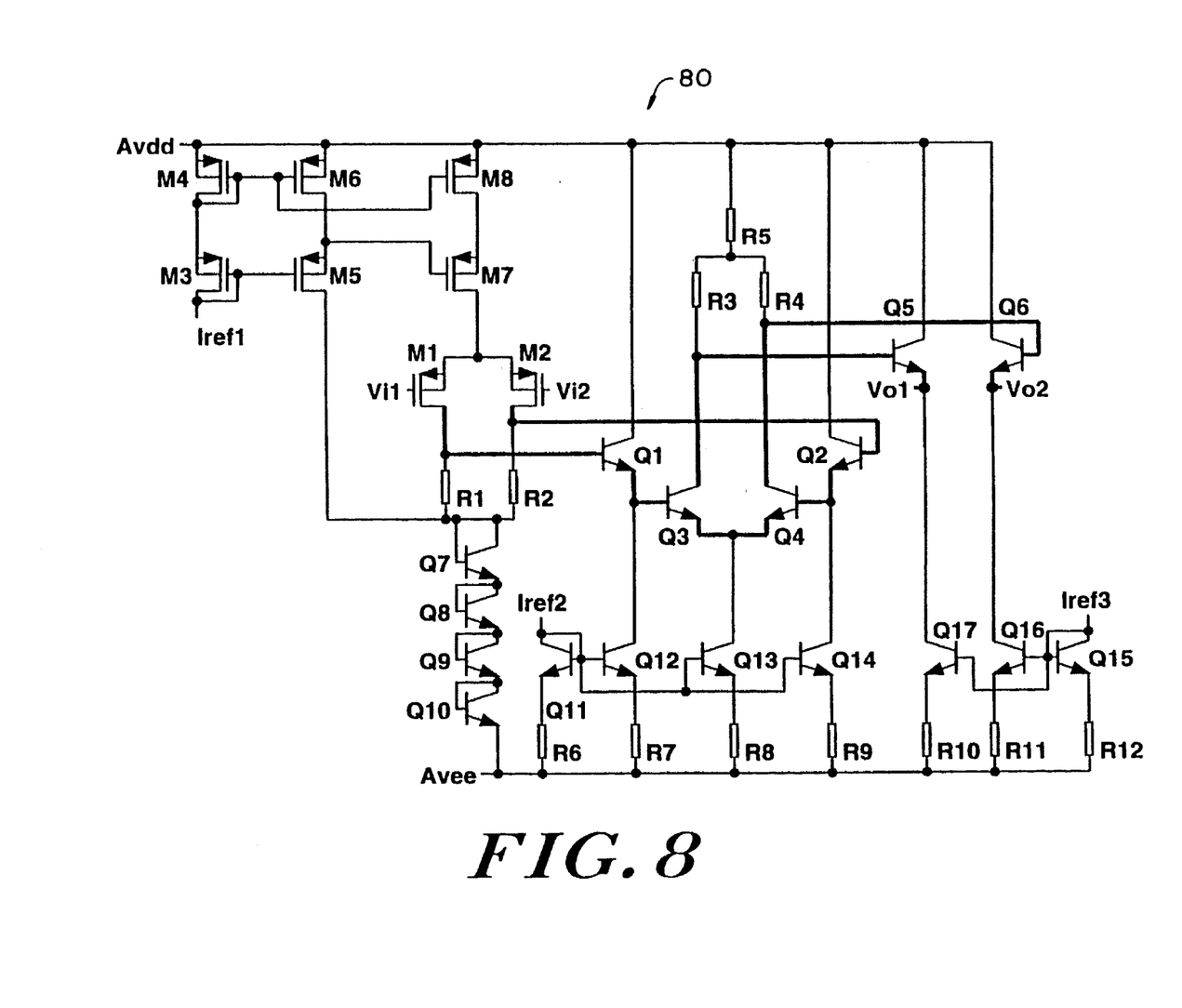
FIG. 8 shows an exemplary comparator pre-amplifier for use in the pipeline ADC of the present invention.

An exemplary comparator pre-amplifier 80 for use in the pipeline ADC of the present invention is shown in FIG. 8. A two-stage, open loop design is used. A PMOS differential input pair, composed of devices $M_1$ and $M_2$, is used for analogous reasons as for the op-amp 70. Focus will be placed on the right half of the remainder of the pre-amp signal path. Emitter follower $Q_2$ is used as a buffer between the first stage output and the second stage input. A bipolar differential pair, composed of devices $Q_3$ and $Q_4$, is principally used to achieve the gain in the pre-amp 80.

Emitter follower $Q_6$ is used to prevent loading of the second stage output. Devices $Q_{7-10}$ are used to establish sufficient common mode input level to bases of $Q_1$ and $Q_2$ so that $V_{CB}$ for $Q_{13}$ remains positive. The comparator uses two pre-amplifiers in cascade, connected using coupling capacitors, which then drive a CMOS cross-coupled latch. Open loop offset cancellation is used to reduce the input referred offset of the pre-amplifiers well within the calibration range. The gain of each pre-amplifier is approximately 60. Since passive loads are used in the pre-amplifier design with low gain, a common mode feedback scheme is not required.

Figure 9:
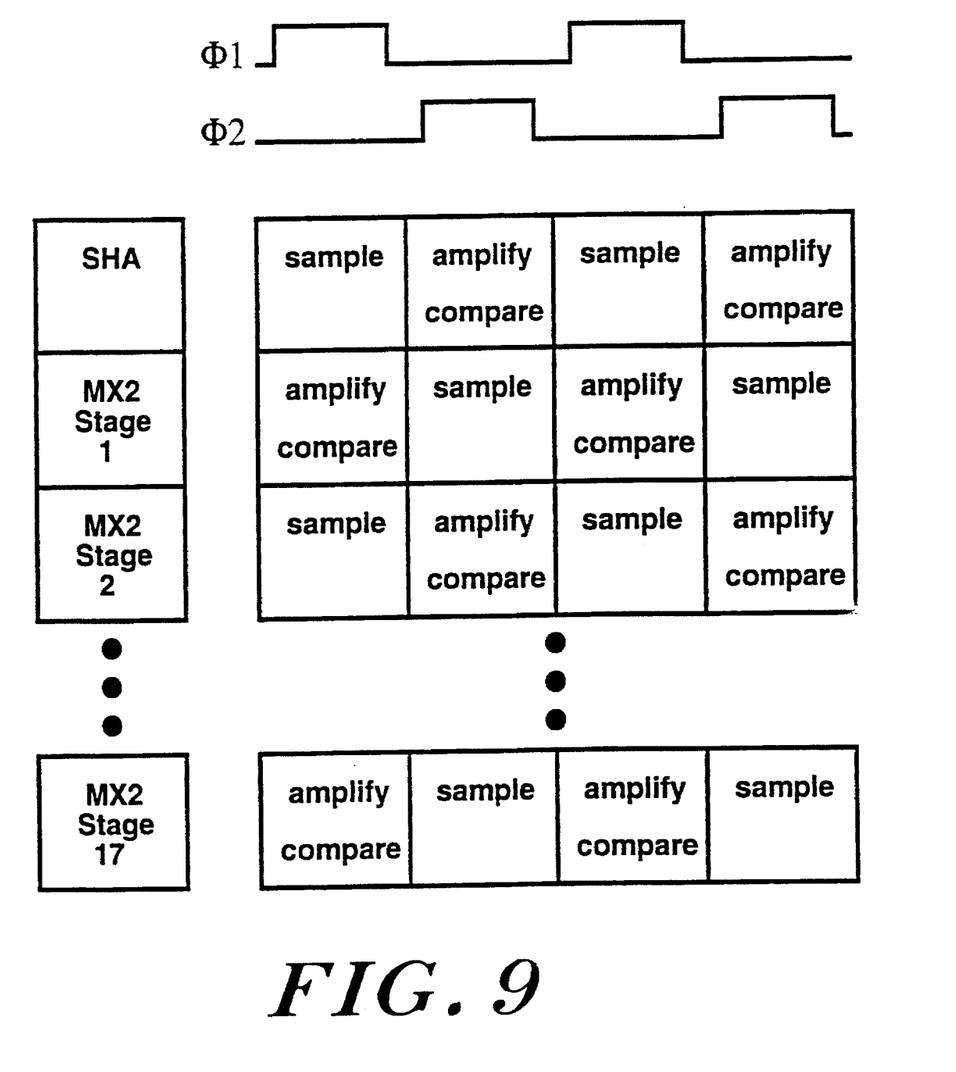
FIG. 9 shows an illustrative timing pattern for the pipeline ADC of the present invention.

An illustrative timing pattern for the pipeline ADC of the present invention is shown in FIG. 9. Two-phase, non-overlapping clocks $\phi_1$ and $\phi_2$ are used. The analog input to the pipeline ADC is presented to the SHA while $\phi_1$ is high. At the end of phase $\phi_1$, the analog input is sampled. When $\phi_2$ is high, the SHA switches to the amplify mode and its output is presented to the input of MX2 Stage 1. At the end of phase $\phi_2$, the analog input presented to MX2 Stage 1 is sampled. Also, at the end of phase $\phi_2$, the comparator monitoring the output in the SHA is strobed and the input bit D(0) for MX2 Stage 1 is determined. This process continues until the ADC input data in question reaches the end of the pipeline. New ADC input data is sampled at the end of each phase $\phi_1$. Thus, the throughput of the ADC is the period of the clock, or 1 μs. The latency of the ADC is 18 clock periods, or 18 μs. Shift registers can be used to time align the pipeline output data.

Figure 10A:
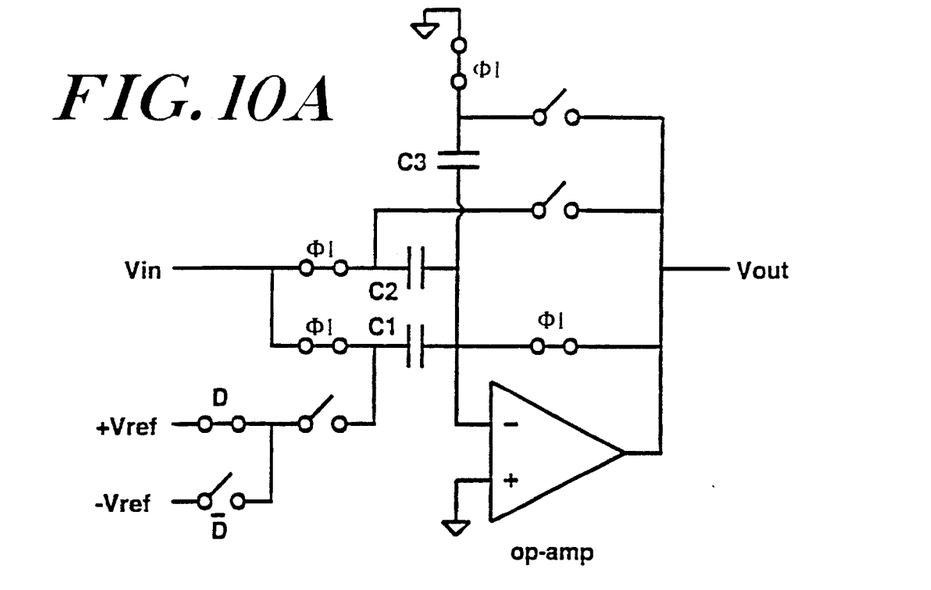
FIGS. 10A and 10B respectively show an MX2 amplifier circuit for an even numbered stage in the sample phase and amplify phase.
Figure 10B:
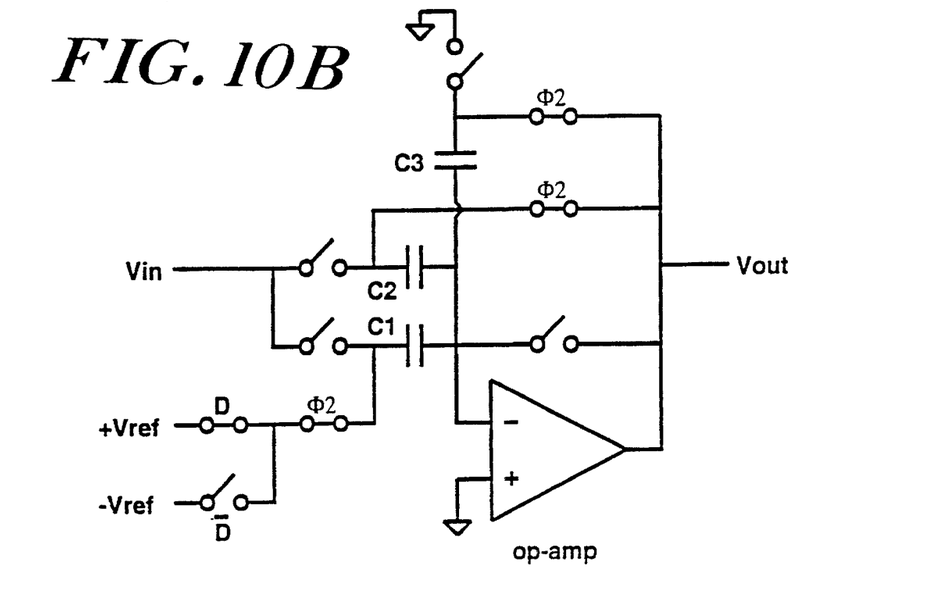

FIGS. 10A and 10B respectively show an MX2 amplifier circuit for an even numbered stage in the sample phase and amplify phase. Although the preferred implementation is fully-differential, a single-ended version is shown for simplicity of illustration. The capacitors $C_1$ and $C_2$ are nominally equal. A small capacitor $C_3$ is added in the circuit to reduce the nominal gain to 1.93. $C_2$ can be expressed as $C_2 = (1+\alpha)C_1$ where $\alpha$ indicates the mismatch between $C_1$ and $C_2$, thus $|\alpha| \ll 1$. Nominally, $C_3 = \beta C_1$ where $\beta = 0.035$. The top plates of the double-poly capacitors $C_1$, $C_2$ and $C_3$ are connected to the op-amp input. The nominal value of $C_1$ and $C_2$ is 1 pF. During the sample phase, the op-amp is in the unity gain connection and the analog input $V_{in}$ is presented to the bottom plates of the input capacitors $C_1$ and $C_2$. The bottom plate of $C_3$ is grounded. During the amplify phase, the op-amp is in the inverting connection with the bottom plates of capacitors $C_2$ and $C_3$ connected to the op-amp output and the bottom plate of $C_1$ connected to $+V_{ref}$ if D=1 or $-V_{ref}$ if D=0. Performing a charge balance between sample and amplify phases, for the case D=1 the output can be shown to be:

$$V_{out} = \frac{(2+\alpha)V_{in} - V_{ref}}{1+\alpha+\beta} \approx 0.965(2V_{in} - V_{ref}) \quad (3)$$

Accordingly, the present invention includes a digital self-calibration process based on radix less than 2 applied to a 1-bit per stage pipeline ADC. This process accounts for capacitor mismatch, comparator offset, finite op-amp gain and accounts for DNL error contributed by circuit nonlinearities. The digital self-calibration process described requires only addition, subtraction and small data storage. In addition, the calibration process in accordance with the present invention can be used with cyclic ADC architectures.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

We claim:

1. A self-calibrating pipeline analog-to-digital converter, said converter having a plurality of analog-to-digital conversion units and including a recursive calibrating section operable for calibrating errors associated with an immediately preceding first conversion unit, said recursive calibrating section comprising:

means for receiving an analog output signal generated from said first conversion unit in response to an analog input signal provided to said first conversion unit;

means for receiving a digital output signal generated from said first conversion unit in response to a digital input signal provided to said first conversion unit;

means for generating a conversion signal corresponding to a quantized representation of said analog output signal; and means for generating a calibration signal having a value equal to said conversion signal in response to said digital input signal being a first digital value and having a value equal to the sum of said conversion signal and a calibration value in response to said digital input signal being a second digital value.

2. The converter of claim 1, wherein said first digital value is zero and said second digital value is non-zero.

3. The converter of claim 1, wherein said calibration value comprises the difference between first and second calibration constants.

4. The converter of claim 3, wherein said first calibration constant corresponds to said conversion signal when said analog input signal is zero and said digital input signal is zero, and said second calibration constant corresponds to said conversion signal when said analog input signal is zero and said digital input signal is non-zero.

5. The converter of claim 3, wherein said first calibration constant corresponds to said conversion signal when said analog input signal is a first analog value and does not exceed a predetermined offset limit and said digital input signal is zero, and said second calibration constant corresponds to said conversion signal when said analog input signal is said first analog value and does not exceed said predetermined offset limit and said digital input signal is non-zero.

6. The converter of claim 5, wherein said first analog value is approximately zero.

7. The converter of claim 1, wherein said recursive calibrating section comprises at least one of said analog-to-digital conversion units.

8. The converter of claim 7, wherein said recursive calibrating section is modified to include said first conversion unit in order to calibrate a second conversion unit which immediately precedes said first conversion unit.

9. The converter of claim 8, wherein said modified calibrating section generates a modified calibration signal having a value equal to said calibration signal in response to the digital input signal to said second conversion unit being zero and having a value equal to the sum of said calibrating signal and a modified calibration value in response to the digital input signal to said second conversion unit being non-zero.

10. The converter of claim 9, wherein said modified calibration value comprises the difference between third and fourth calibration constants.

11. The converter of claim 10, wherein said third calibration constant corresponds to a quantized representation of the analog output signal of said second conversion unit when the analog input signal to said second conversion unit is zero and the digital input signal to said second conversion unit is zero, and said fourth calibration constant corresponds to a quantized representation of the analog output signal of said second conversion unit when the analog input signal to said second conversion unit is zero and the digital input signal to said second conversion unit is non-zero.

12. The converter of claim 1, wherein each of said conversion units comprise a single analog-to-digital conversion stage.

13. The converter of claim 12, wherein said single analog-to-digital conversion stage comprises a one-bit radix less than two stage.

14. The converter of claim 12, wherein said single analog-to-digital conversion stage comprises a k-bit radix less than $2^k$ stage.

* * * * *